United States Patent
Hwang et al.

(10) Patent No.: US 9,691,798 B2
(45) Date of Patent: Jun. 27, 2017

(54) DISPLAY DEVICE

(71) Applicant: Samsung Display Co., Ltd, Yongin-si, Gyeonggi-do (KR)

(72) Inventors: In-Jae Hwang, Suwon-si (KR); Mee Hye Jung, Suwon-si (KR); Jang Mi Kang, Bucheon-si (KR); Il Gon Kim, Seoul (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/054,591

(22) Filed: Feb. 26, 2016

(65) Prior Publication Data
US 2016/0252783 A1    Sep. 1, 2016

(30) Foreign Application Priority Data
Feb. 27, 2015    (KR) .......................... 10-2015-0028563

(51) Int. Cl.
*G02F 1/1343*    (2006.01)
*H01L 27/12*    (2006.01)
*G02F 1/1337*    (2006.01)

(52) U.S. Cl.
CPC .... *H01L 27/1248* (2013.01); *G02F 1/133707* (2013.01); *G02F 1/134336* (2013.01); *H01L 27/124* (2013.01); *H01L 27/1251* (2013.01); *G02F 2001/133757* (2013.01); *G02F 2001/134345* (2013.01)

(58) Field of Classification Search
CPC ............. H01L 27/1248; H01L 27/1251; H01L 27/124; G02F 1/133707; G02F 1/134336; G02F 2001/133757; G02F 2001/134345
See application file for complete search history.

(56) References Cited

U.S. PATENT DOCUMENTS

2014/0267962 A1*  9/2014  Jung ................ G02F 1/134363
                                                   349/33

FOREIGN PATENT DOCUMENTS

| KR | 1008517430000 | 8/2008 |
| KR | 10-2012-0100565 A | 9/2012 |
| KR | 1012484560000 | 3/2013 |
| KR | 10-2013-0104521 A | 9/2013 |

* cited by examiner

Primary Examiner — Donald Raleigh
(74) Attorney, Agent, or Firm — Innovation Counsel LLP

(57) ABSTRACT

A display device includes: an insulating layer positioned on a first insulating substrate; a pixel electrode including a first subregion electrode applied with a first voltage and positioned beneath the insulating layer, a first subpixel electrode which includes a second subregion electrode positioned on the insulating layer, and a second subpixel electrode which is positioned on the insulating layer and applied with a second voltage; a second insulating substrate facing the first insulating substrate; and a common electrode positioned under the second insulating substrate and applied with a common voltage, wherein one pixel area is divided into a first part in which the second subregion electrode is positioned, a second part in which the first subregion electrode and a portion of the second subpixel electrode overlap each other, and a third part which does not overlap the first subregion electrode in the second subpixel electrode.

20 Claims, 15 Drawing Sheets

DISPLAY DEVICE

CROSS-REFERENCE TO RELATED APPLICATION

This application claims priority to and the benefit of Korean Patent Application No. 10-2015-0028563 filed in the Korean Intellectual Property Office on Feb. 27, 2015, the entire contents of which are incorporated herein by reference.

BACKGROUND (a) Field of the Invention

The present invention relates to a display device.

(b) Description of the Related Art

A liquid crystal display is one type of flat panel display which has been most widely used. A liquid crystal display includes two sheets of display panel in which field generating electrodes, such as a pixel electrode and a common electrode, are formed, and a liquid crystal layer interposed therebetween.

The field generating electrode is applied with a voltage to generate an electric field in the liquid crystal layer. The electric field aligns the liquid crystal molecules of the liquid crystal layer, and the alignment of the liquid crystal molecules determines and the polarization of incident light to display an image.

The liquid crystal display further includes switching elements connected to each of the pixel electrodes, and a plurality of signal lines, such as gate lines and data lines, which control the switching elements to apply a voltage to the pixel electrodes.

Among the liquid crystal displays, a liquid crystal display in a vertically aligned (VA) mode in which major axes of the liquid crystal molecules are aligned to be vertical to the display panel in a state in which an electric field is not applied has a large contrast ratio and a wide reference viewing angle, and therefore has drawn much attention. Herein, a reference viewing angle means a viewing angle in which a contrast ratio is 1:10 or an inter-gray luminance inversion critical angle.

In the case of a liquid crystal display that uses a vertically aligned (VA) mode, to make side visibility approximate front visibility, a method for making transmittance different by dividing one pixel into two subpixels and applying different voltages to the two subpixels has been suggested.

Meanwhile, to prevent a distortion for the same viewing distance and improve presence of a screen, a curved display device has been developed. However, in the case of the curved display device, a reverse texture may occur due to a misalign problem between upper and lower plates and transmittance may be reduced due to the occurrence of a dark part.

The above information disclosed in this Background section is only for enhancement of understanding of the background of the invention and therefore it may contain information that does not form the prior art that is already known to a person of ordinary skill in the art.

SUMMARY

A display device having advantages of a pixel structure which may prevent a texture from occurring due to a shift of a display panel in a curved display device is provided.

A display device, includes: a first insulating substrate; an insulating layer positioned on the first insulating substrate; a pixel electrode including a first subregion electrode which is applied with a first voltage and positioned beneath the insulating layer, a first subpixel electrode which includes a second subregion electrode positioned on the insulating layer, and a second subpixel electrode which is positioned on the insulating layer and applied with a second voltage; a second insulating substrate facing the first insulating substrate; and a common electrode positioned under the second insulating substrate and applied with a common voltage, wherein one pixel area is divided into a first part in which the second subregion electrode is positioned, a second part in which the first subregion electrode and a portion of the second subpixel electrode overlap each other, and a third part which does not overlap the first subregion electrode in the second subpixel electrode, depending on a voltage difference between the common voltage and the pixel electrode and an interface at which an end of the second subregion electrode faces an end of the second subpixel electrode is positioned on the first subregion electrode, having the insulating layer disposed therebetween.

A voltage difference from the common voltage may be greater in the first part than in the second part, and greater in the second part than in the third part.

The first subpixel electrode and the second subpixel electrode may include an upper unit electrode and a lower unit electrode which are adjacent to each other, having a gap disposed therebetween.

The first subregion electrode and the second subregion electrode may be electrically connected to each other through a contact hole.

The first subregion electrode may overlap a portion of the second subpixel electrode and may be an integrated plate shape for the overlapping part.

The display device may have a curved shape having a predetermined curvature radius.

The second subregion electrode and the second subpixel electrode may each include a horizontal stem part and a plurality of fine branch parts may extend to be inclined in two different directions from the horizontal stem part.

The display device may further include: a lower display panel including the first insulating substrate, the insulating layer, and the pixel electrode; an upper display panel including the second insulating substrate and the common electrode; and a liquid crystal layer injected between the lower display panel and the upper display panel, wherein liquid crystal molecules of the liquid crystal layer positioned at one side of the horizontal stem part are aligned in a first direction and the liquid crystal molecules of the liquid crystal layer positioned at the other side of the horizontal stem part are aligned in a second direction.

An angle formed by an extending direction of the plurality of fine branch parts positioned at one side of the horizontal stem part and an extending direction of the plurality of fine branch parts positioned at the other side of the horizontal stem part may range from 80 to 100°.

The second subregion electrode and the second subpixel electrode may be disposed to form a quadrangle on a plane.

The second subregion electrode and the second subpixel electrode may have different slopes to the horizontal stem part and have an interface spaced at a predetermined interval.

An area corresponding to the second part in the first subregion electrode may have an integrated plate shape.

The first subpixel electrode and the second subpixel electrode may each include a first connection part and a second connection part which connect between an upper unit electrode and a lower unit electrode.

The first connection part may be positioned at a gap between the upper unit electrode and the lower unit electrode on the same layer as the first subregion electrode and may be parallel with the horizontal stem part.

The second connection part may extend from an end of at least one of the plurality of fine branch parts of the second subpixel electrode to connect between the upper unit electrode and the lower unit electrode.

The display device may further include: a first thin film transistor connected to the first subpixel electrode; a second thin film transistor connected to the second subpixel electrode; and a voltage dividing transistor connected to the second thin film transistor, wherein the first thin film transistor is connected to the first subregion electrode of the first subpixel electrode.

The second subregion electrode may be applied with the first voltage from the first subregion electrode.

The first subregion electrode may overlap a portion of the second subpixel electrode and a difference between the first voltage and the common voltage may be larger than a difference between the second voltage and the common voltage.

The first subregion electrode may have an edge in a concave hexagonal shape which has a double arrow bracket (<< or >>), the second subregion electrode may be a triangle shape formed of one bottom side and two oblique sides, and the second subpixel electrode may have a concave pentagonal shape.

The second subregion electrode and the second subpixel electrode may include a plurality of fine branch parts which extend in two different directions.

According to the display device in accordance with an exemplary embodiment of the present invention, it is possible to provide the accurate gray representation in the low gray region while making the side visibility approximate the front visibility and reduce the texture from occurring due to the shift of the display panel in the case of providing the curved display device.

DETAILED DESCRIPTION OF THE EMBODIMENTS

Figure 1:
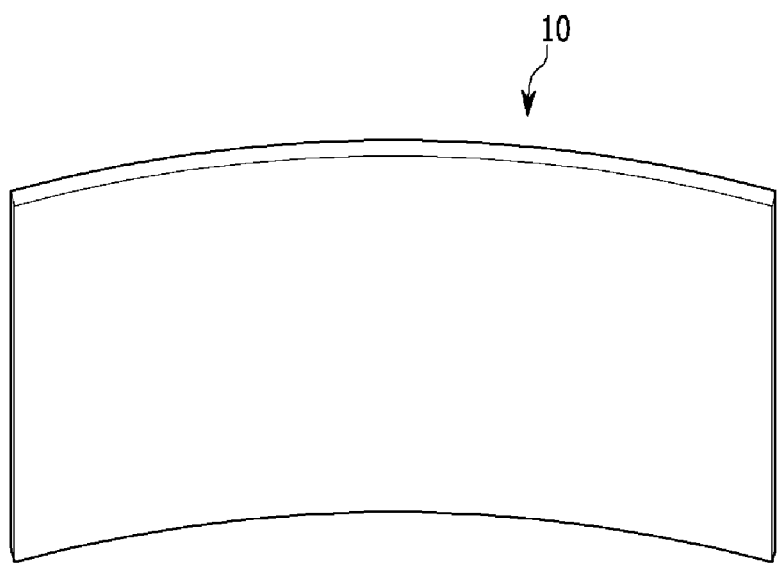
FIG. 1 is a perspective view of a curved display device according to an exemplary embodiment.

Hereinafter, exemplary embodiments will be described in detail with reference to the accompanying drawings. However, the present invention is not limited to the exemplary embodiments set forth herein but may be modified in many different forms. On the contrary, exemplary embodiments introduced herein are provided to make disclosed contents thorough and complete and sufficiently transfer the spirit of the present disclosure to persons or ordinary skill in the art.

In the drawings, the thickness of layers, films, panels, regions, etc., is exaggerated for clarity. Further, it will be understood that when a layer is referred to as being "on" another layer or substrate, it can be directly on the other layer or substrate, or other layers intervening between them may also be present. Like reference numerals designate like elements throughout the specification.

Figure 2:
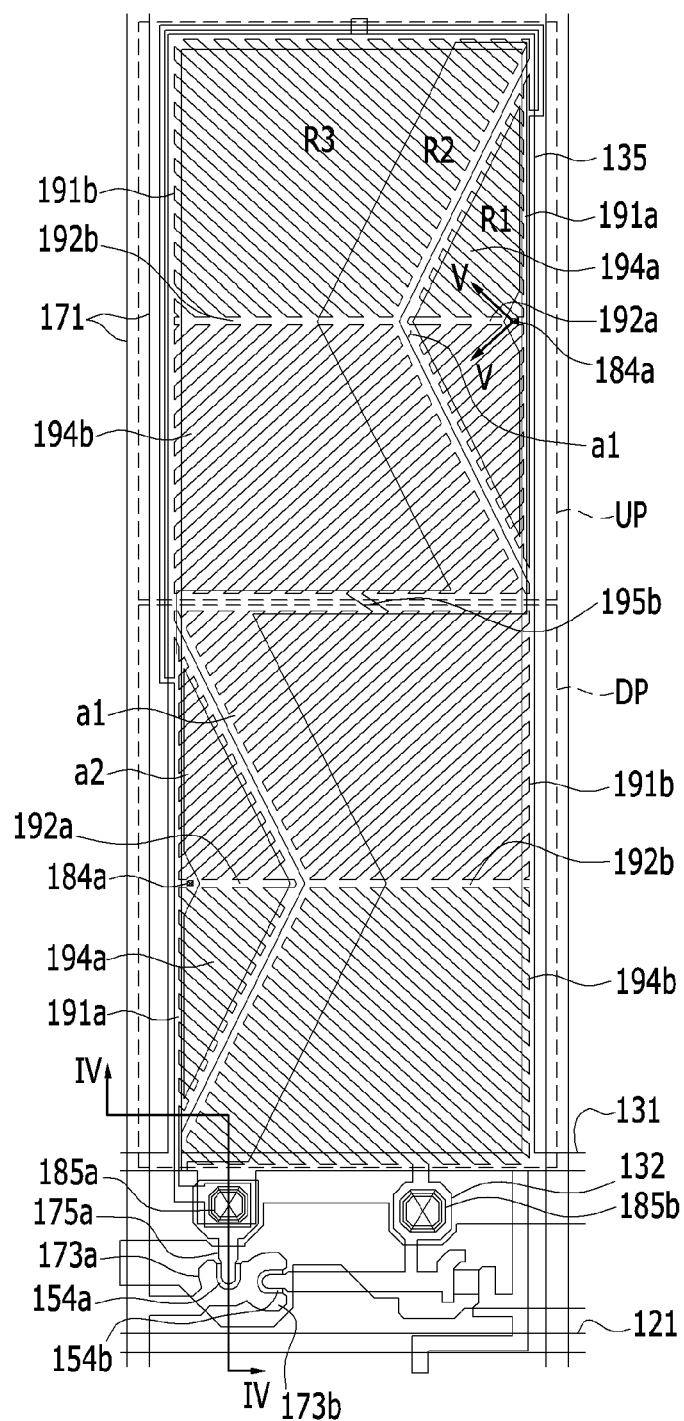
FIG. 2 is a plan view of one pixel according to an exemplary embodiment.
Figure 3:
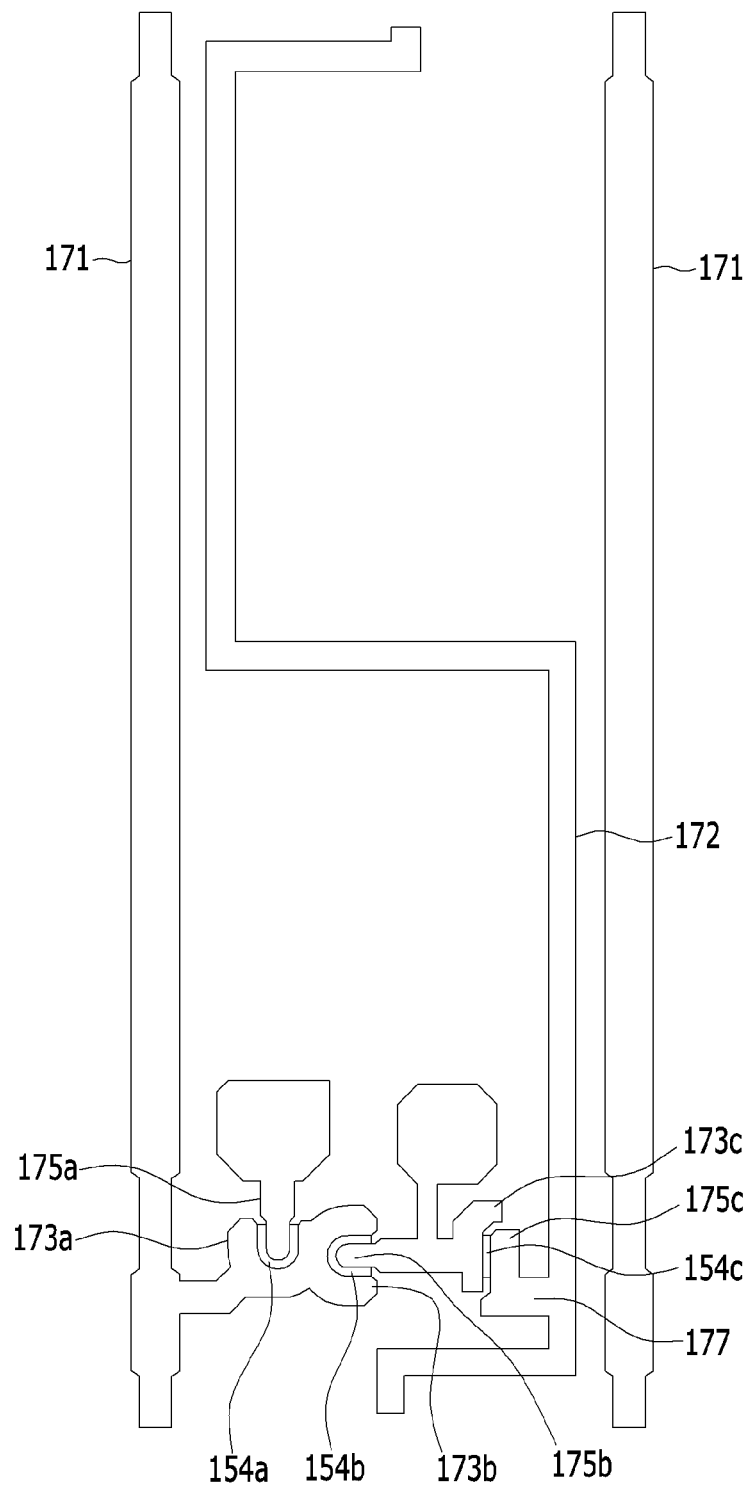
FIG. 3 is a plan view of a data conductor layer according to an exemplary embodiment.
Figure 4:
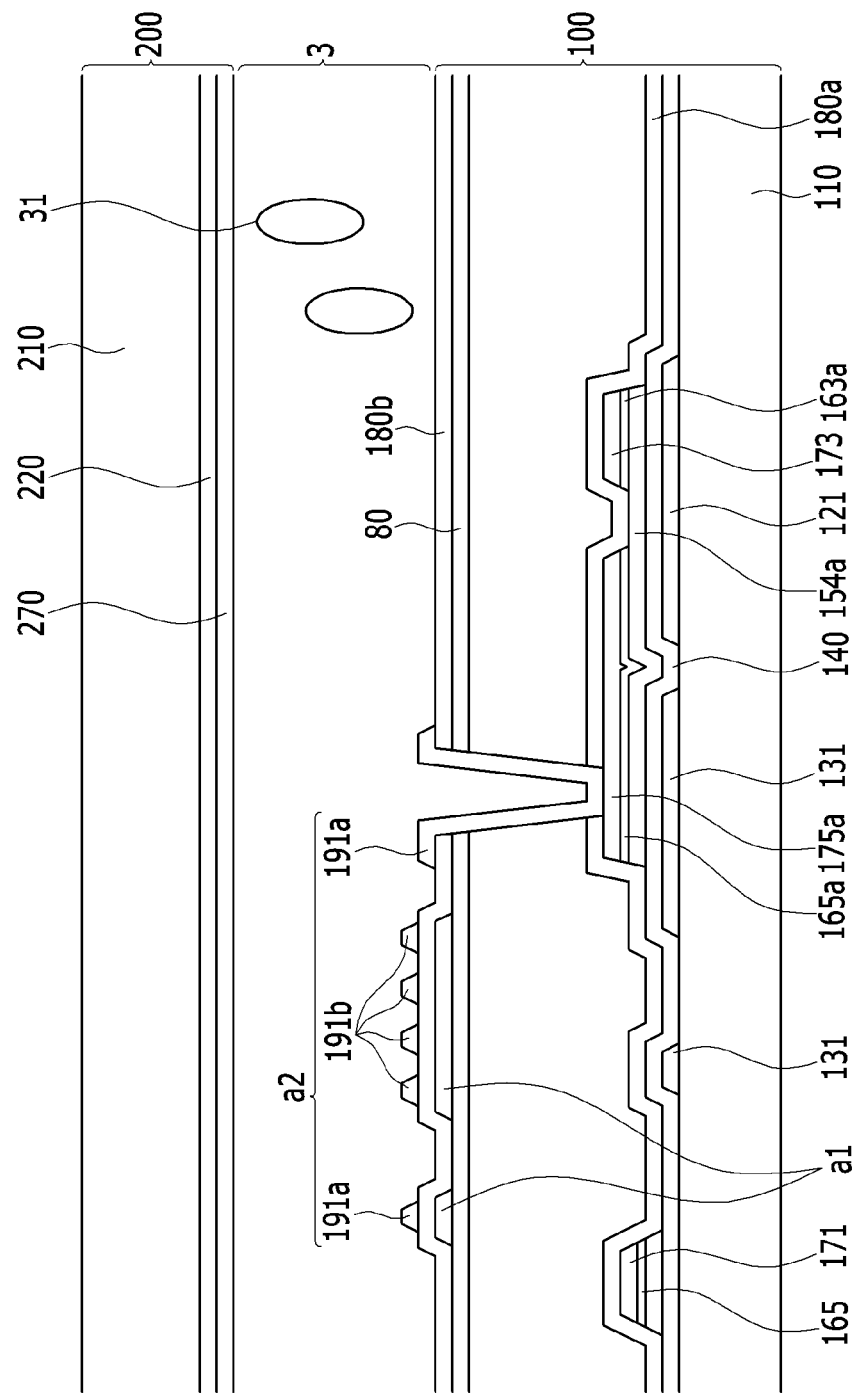
FIG. 4 is a cross-sectional view taken along the line IV-IV of FIG. 2.
Figure 5:
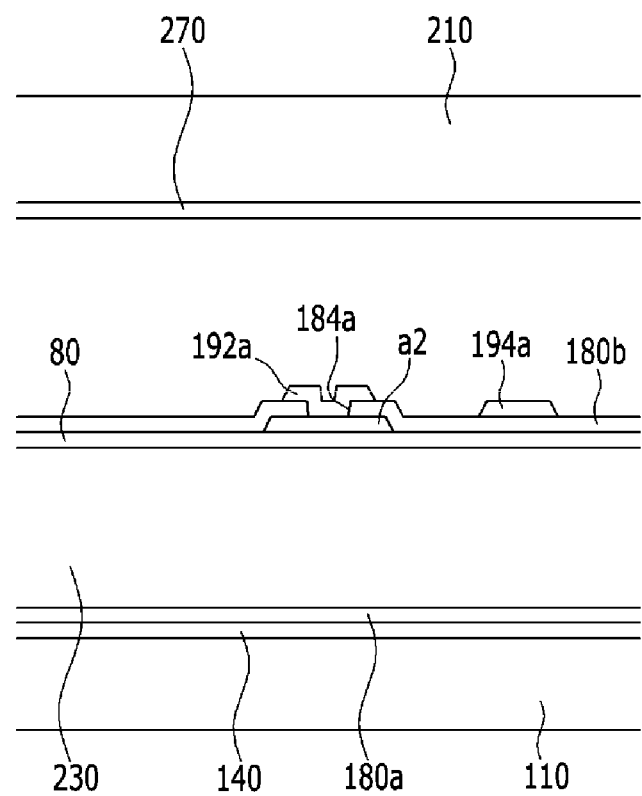
FIG. 5 is a cross-sectional view taken along the line V-V of FIG. 2.

Hereinafter, a display device according to an exemplary embodiment will be described with reference to FIGS. 1 to 5. FIG. 1 is a perspective view of a curved display device according to an exemplary embodiment, FIG. 2 is a plan view of one pixel according to an exemplary embodiment, FIG. 3 is a plan view of a data conductor layer according to an exemplary embodiment, FIG. 4 is a cross-sectional view taken along the line IV-IV of FIG. 2, and FIG. 5 is a cross-sectional view taken along the line V-V of FIG. 2.

Referring to FIG. 1, a display device 10 according to an exemplary embodiment is a curved display device. The display device is bent in a concave shape or a convex shape and thus may be formed in a curved shape. The present disclosure describes a display device that may be a landscape type, which from a standpoint of a viewer has a horizontal length longer than a vertical length, and is bent in a horizontal direction. But the present invention is not limited thereto and therefore the display device may be a portrait type which has a horizontal length shorter than a vertical length, and is bent in a horizontal direction, or the display device may be bent in a vertical direction. However, the present invention is not limited thereto and therefore the display device may be a flat display device.

The display device according to the exemplary embodiment includes a lower display panel 100 and an upper display panel 200 which face each other and a liquid crystal layer 3 which is interposed between the two display panels 100 and 200 and includes a liquid crystal molecule 31.

First, the lower display panel 100 will be described.

A gate conductor which includes the gate line 121 and a sustain electrode lines 131 and 132 is positioned on a first insulating substrate 110 made of transparent glass, plastic, or the like. The gate line 121 mainly extends in a horizontal direction to transfer a gate signal.

The gate line 121 includes a wide end (not illustrated) so as to be connected to a first gate electrode 124a, a second gate electrode 124b, a third gate electrode 124c, and other layers or external driving circuits.

The gate line 121 and the sustain electrode lines 131 and 132 may be made of aluminum-based metals, such as aluminum (Al) and aluminum alloy, silver-based metals, such as silver (Ag) and silver alloy, copper-based metals, such as copper (Cu) and copper alloy, molybdenum-based metals, such as molybdenum (Mo) or molybdenum alloy, chromium (Cr), tantalum (Ta), titanium (Ti), and the like. The gate line 121 may also have a multilayer structure including at least two conductive layers having different physical properties.

The gate line 121 crosses a pixel area in a horizontal direction. A first subpixel electrode 191a displaying high gray and a second subpixel electrode 191b displaying low gray may be positioned over the gate line 121.

The sustain electrode lines 131 and 132 may be made of the same material as the gate line 121 and may be formed simultaneously with the gate line 121. The present disclosure describes and illustrates a shape of the sustain electrode lines 131 and 132 as described above, but a shape of the sustain electrode lines 131 and 132 is not limited thereto, and therefore the sustain electrode lines 131 and 132 may have any shape for performing the same function. A gate insulating layer 140 is positioned on a gate conductor. A first semiconductor layer 154a, a second semiconductor layer 154b, and a third semiconductor layer 154c are positioned on the gate insulating layer 140.

A plurality of ohmic contacts 163a, 165a, 163a, 165b, and 163c are positioned on the semiconductor layers 154a, 154b, and 154c and when the semiconductor layers 154a, 154b, and 154c are made of oxide semiconductor, an ohmic contact may be omitted.

The data lines 171 which include a first source electrode 173a and a second source electrode 173b and data conductors 171, 173a, 173b, 173c, 175a, 175b, and 175c which include a first drain electrode 175a, a second drain electrode 175b, a third source electrode 173c, and a third drain electrode 175c are formed on the ohmic contacts 163a, 163b, 163c, 165a, 165b and the gate insulating layer 140.

The second drain electrode 175b is connected to the third source electrode 173c and the third drain electrode 175c is connected to an extension 177 of a voltage dividing reference voltage line 172. The data conductor, the ohmic contact, and the semiconductor positioned thereunder may be simultaneously formed using a single mask.

FIG. 3 is a plan view of a data conductor layer according to an exemplary embodiment.

The data conductor includes the data line 171, the first source electrode 173a, the second source electrode 173b, the third source electrode 173c, the first drain electrode 175a, the second drain electrode 175b, the third drain electrode 175c, and the voltage dividing reference voltage line 172.

The data line 171 vertically extends along a single pixel area edge and includes the first source electrode 173a and the second source electrode 173b. The first source electrode 173a and the second source electrode 173b may have a U-letter shape but are not limited thereto.

The first drain electrode 175a faces the first source electrode 173a. According to an exemplary embodiment, the first drain electrode 175a includes an Metter shape which corresponds to the first source electrode 173a having a U-letter shape and may include a widely extended region which is connected to the first subpixel electrode 191a.

The second drain electrode 175b faces the second source electrode 173b. According to an exemplary embodiment, the second drain electrode 175b includes an I-letter shape which corresponds to the second source electrode 173b having a U-letter shape and may include a widely extended region which is connected to the second subpixel electrode 191b.

The third source electrode 173c extends from one surface of the second drain electrode 175b.

Further, the data conductor includes the voltage dividing reference voltage line 172 which includes the third source electrode 173c and the third drain electrode 175c forming a thin film transistor.

Referring to FIG. 3, the voltage dividing reference voltage line 172 includes a plurality of horizontal parts and a plurality of vertical parts connecting therebetween. That is, the voltage dividing reference voltage line 172 includes the plurality of horizontal parts and the plurality of vertical parts connecting therebetween, in which the vertical parts may be connected to one end or a middle of parallel horizontal parts. In the pixel according to an exemplary embodiment, the voltage dividing reference voltage line 172 may extend along an edge of the first subpixel electrode 191a.

The first gate electrode 124a, the first source electrode 173a, and the first drain electrode 175a form a first thin film transistor (TFT) Qa, along with a first semiconductor layer 154a and a channel of the first thin film transistor is formed on the first semiconductor layer 154a between the first source electrode 173a and the first drain electrode 175a. Similarly, the second gate electrode 124b, the second source electrode 173b, and the second drain electrode 175b form one second thin film transistor Qb, along with the second semiconductor layer 154b and a channel of the first thin film transistor is formed on the second semiconductor layer 154b between the second source electrode 173b and the second drain electrode 175b. Further, the third gate electrode 124c, the third source electrode 173c, and the third drain electrode 175c form one third thin film transistor Qc along with the third semiconductor layer 154c and the channel of the third thin film transistor is formed on the third semiconductor layer 154c between the third source electrode 173c and the third drain electrode 175c. The third thin film transistor may serve as a voltage dividing transistor and is controlled according to a gate signal which is transferred through the gate line 121, and when the third switching element Qc and the second switching element Qb are turned on, a data voltage transferred through the data line 171 is divided by the second switching element Qb and the third switching element Qc and then may be transferred to a liquid crystal capacitor.

A passivation layer 180 which may be made of inorganic insulating materials such as silicon nitride or silicon oxide is formed on the data conductors 171, 173a, 173b, 173c, 175a, 175b, and 175c and the exposed semiconductor layers 154a, 154b, and 154c.

A color filter 230 is positioned on the passivation layer 180a and the passivation layer 180a serves to prevent a pigment of the color filter 230 from flowing in the exposed semiconductor layers 154a, 154b, and 154c. The color filter 230 may uniquely display one of the primary colors and an example of the primary colors may include the three primary colors, such as red, green, and blue, or yellow, cyan, magenta, and the like. The color filter 230 may further include a color filter which displays a mixed color of the primary colors or white, in addition to the primary colors.

A light blocking member (not illustrated) may be positioned in an area in which the color filter 230 is not positioned and on a portion of the color filter 230. The light blocking member is referred to as a black matrix and prevents light from leaking.

The passivation layer 180 and the color filter 230 are provided with a first contact hole 185a and a second contact hole 185b through which the first drain electrode 175a and the second drain electrode 175b are exposed.

The pixel electrode 191 is positioned on the color filter 230. The pixel electrode 191 includes the first subpixel electrode 191a and the second subpixel electrode 191b which are adjacent to each other in a column direction.

The pixel electrode 191 may be made of transparent conductive materials, such as ITO and IZO. The pixel electrode 191 may also be made of the transparent conductive materials, such as ITO and IZO or reflective metals, such as aluminum, silver, chromium, or an alloy thereof.

A shielding electrode may be positioned on the same layer as a layer on which the pixel electrode is positioned (not illustrated). According to the exemplary embodiment of the present invention, a portion of the first subpixel electrode and the second subpixel electrode are each positioned on different layers and thus all the shielding electrodes may also be positioned on a layer on which each of the subpixel electrodes is positioned (dual layer shielding com, DLSC). According to another exemplary embodiment, when all the subpixel electrodes are positioned on the same layer (when the pixel electrode is formed only in a single layer), the shielding electrode may be formed on the same layer as or different layers from the pixel electrode (single layer shielding com, SLSC). Instead of the light blocking member, the shielding electrode may be positioned in an area overlapping the data line and may be applied with a voltage having the same magnitude as a common electrode 270 to serve as the light blocking member. That is, the shielding electrode displays black due to a vertical alignment of liquid crystal molecules, thereby minimizing a light leakage. The shielding electrode may be patterned along with the pixel electrode from a transparent conductive oxide layer and only the shielding electrode is plasma-treated and thus may be opaque. Therefore, an additional mask for sequentially forming the opaque electrodes is not required.

A capping layer 80 is positioned on the color filter 230. The capping layer 80 prevents the color filter 230 from being lifted and suppresses pollution of the liquid crystal layer 3 due to organic materials such as a solvent introduced from the color filter, thereby preventing defects such as afterimage which may occur when a screen is driven.

A first subregion electrode a1 of the first subregion electrode 191a is positioned on the capping layer 80 and an insulating layer 180b is positioned on the first subregion electrode a1.

A second subregion electrode a2 of the first subpixel electrode 191a and the second subpixel electrode 191b are positioned on the insulating layer 180b. In this case, the first subregion electrode a1 and the second subregion electrode a2 of the first subpixel electrode 191a may be connected to each other through a contact hole 184a.

The first subregion electrode a1 of the first subpixel electrode 191a and the second subpixel electrode 191b are each applied with the data voltage from the first drain electrode 175a and the second drain electrode 175b, respectively, through a first contact hole 185a and a second contact hole 185b. The first subregion electrode a1 and the second subregion electrode a2 are electrically connected to each other through the contact hole 184a, and therefore the second subregion electrode a2 is applied with the data voltage (first voltage) which is applied to the first subregion electrode a1.

In more detail, one pixel area of the display device according to an exemplary embodiment includes the first subpixel electrode 191a, the second subpixel electrode 191b, and the common electrode 270, an upper unit electrode UP and a lower unit electrode DP (FIG. 6) which are distinguished depending on a two-dimensional position of the pixel area, and includes a first part R1, a second part R2, and a third part R3 which are distinguished depending on a magnitude of an electric field applied to the pixel area.

The first subregion electrodes a1 of the first subpixel electrodes 191a which are positioned in the upper unit electrode UP and the lower unit electrode DP are positioned on different layers from the second subregion electrodes a2 of the first subpixel electrodes 191a. For example, the first subregion electrodes a1 of the first subpixel electrodes 191a may be positioned on different layers, having the insulating layer disposed therebetween.

The second subregion electrode a2 is electrically connected to the first subregion electrode a1 which is connected to the first thin film transistor and may thus be applied with the first voltage.

The second subregion electrode a2 which is positioned in the one upper or lower unit electrode UP or DP may have approximately a triangle which is formed of one bottom side and two oblique sides, in which the one bottom side may correspond to an edge of the one pixel area.

Further, the first subpixel electrodes 191a which are positioned in the upper unit electrode UP and the lower unit electrode DP may be connected to each other.

For example, the first subpixel electrodes 191a may be connected to each other through a first connection part 195a (FIG. 6) which is formed between the upper unit electrode UP and the lower unit electrode DP.

The first subregion electrode a1 is connected to the first thin film transistor and may thus be applied with the first voltage, which displays the high gray.

The second subpixel electrode 191b includes an edge parallel with one pixel area edge and may include oblique sides corresponding to two oblique sides which are included in the second subregion electrode a2 of the first subpixel electrode 191a. Therefore, reviewing the upper unit electrode UP or the lower unit electrode DP, the second subpixel electrode 191b and the second subregion electrode a2 of the first subpixel electrode 191a may be disposed to indicate a quadrangular shape of which the horizontal and vertical lengths are similar, without overlapping each other on a plane.

According to an exemplary embodiment, an end of the second subregion electrode a2 and an end of the second subpixel electrode 191b are spaced apart from each other at a predetermined interval and the first subregion electrode a1 is positioned under an interface formed by the second subregion electrode a2 and the second subpixel electrode 191b, having the insulating layer 180b disposed therebetween.

Further, the second subpixel electrodes 191b which are positioned in the upper unit electrode UP and the lower unit electrode DP are electrically connected to each other through the second connection part 195b. For example, the second connection part 195b extends from an end of a second fine branch part 194b of the second subpixel electrode 191b and thus may connect between the second subpixel areas 191b which are positioned in the upper unit electrode UP and the lower unit electrode DP.

The second subpixel electrode 191b is connected to a second thin film transistor which is connected to a third thin film transistor (voltage dividing transistor) and may be applied with a second voltage lower than the first voltage.

In this case, an area in which the second subregion electrode a2 is positioned is defined as the first part R1, an area in which the first subregion electrode a1 and the second subpixel electrode 191b overlap each other is defined as the second part R2, and an area which does not overlap the first subregion electrode a1 in the second subpixel electrode 191b is defined as the third part R3. The first subregion electrode a1 may be an integrated plate shape, in the second part R2 in which the first subregion electrode a1 and the second subpixel electrode 191b overlap each other.

Therefore, a strength of the electric field applied to the liquid crystal layer which is positioned in the first part R1 is largest depending on a difference between a voltage applied to each of the pixel electrode and a common voltage and a strength of the electric field applied to the liquid crystal layer which is positioned in the third part R3 is smallest. Because an effect of the electric field by the first subregion electrode a1 of the first subpixel electrode 191a is present in the second part R2, the strength of the electric field applied to the liquid crystal layer which is positioned in the second part R2 is smaller than that of the electric field applied to the liquid crystal layer positioned in the first part R1, and is larger than the strength of the electric field applied to the liquid crystal layer positioned in the third part R3.

As such, in the liquid crystal display according to an exemplary embodiment, one pixel area is divided into the first part R1 in which the first subpixel electrode 191a to which a relatively higher first voltage is applied is positioned, the second part R2 in which a portion of the first subpixel electrode 191a and a portion of the second subpixel electrode 191b to which a relatively lower second voltage is applied overlap each other, having the insulating layer disposed therebetween, and the third part R3 in which only the second subpixel electrode 191b to which the relatively lower second voltage is applied is positioned. This will be described in more detail with reference to FIGS. 6 to 9.

Next, the upper display panel 200 will be described.

The light blocking member 220 and a common electrode 270 are formed on the second insulating substrate 210 made of transparent glass, plastic, or the like.

However, in the case of the liquid crystal display according to another exemplary embodiment, the light blocking member 220 may be positioned on the lower display panel 100 and in the case of the liquid crystal display according to another exemplary embodiment, the color filter may be positioned on the upper display panel 200.

The inner surfaces of the display panels 100 and 200 are provided with the alignment layers (not illustrated) which may be the vertical alignment layer (not illustrated).

The polarizer (not illustrated) is disposed on the outer surfaces of the two display panels 100 and 200 and the transmission axes of the two polarizers are orthogonal to each other, in which one of the transmission axes is preferably parallel with the gate line 121. However, the polarizer may also be disposed only on the outer surface of any one of the two display panels 100 and 200.

The liquid crystal layer 3 has a negative dielectric anisotropy and the liquid crystal molecules of the liquid crystal layer 3 are aligned so that the major axes thereof are vertical to the surfaces of the two display panels 100 and 200 in the state in which no electric field is present. Therefore, incident light does not pass through the crossed polarizers but is blocked, in the state in which no electric field is present.

At least one of the liquid crystal layer 3 and an alignment layer may include a photoreactive material, in more detail, reactive mesogen.

Next, a method for driving a display device, for example, a liquid crystal display according to an exemplary embodiment will be briefly described. This may refer to a circuit diagram illustrated in FIGS. 10 to 14 (which circuit diagrams will be described in more detail further below).

When a gate on signal is applied to the gate line 121, a gate on signal is applied to the first gate electrode 124a, the second gate electrode 124b, and the third gate electrode 124c and thus a first switching element Qa, a second switching element Qb, and a voltage dividing transistor QC which is a third switching element are turned on. Therefore, the data voltage applied to the data line 171 is applied to a first subpixel electrode 191a and a second subpixel electrode 191b, respectively, through the first and second switching elements Qa and Qb which are turned on. In this case, the first subpixel electrode 191a and the second subpixel electrode 191b are applied with the same magnitude of first voltage. However, the voltage applied to the second subpixel electrode 191b is divided by the voltage dividing transistor Qc which is the third switching element connected to the second switching element Qb in series and thus becomes the second voltage. Therefore, the voltage which is applied to the second subpixel electrode 191b is smaller than the voltage applied to the first subpixel electrode 191a.

Referring back to FIG. 2, one pixel area of the display device according to an exemplary embodiment is configured to include the first part R1 in which only the second subregion electrode a2 of the first subpixel electrode 191a is positioned, the second part R2 having the first subregion electrode a1 of the first subpixel electrode 191a positioned therein and overlapping the second subpixel electrode 191b, and the third part R3 in which a portion of the second subpixel electrode 191b, that is, only a portion of the second subpixel electrode 191b which does not overlap the first subregion electrode a1 of the first subpixel electrode 191a is positioned.

Further, one pixel area includes the upper unit electrode UP and the lower unit electrode DP which are positioned on the lower display panel 100 and the common electrode 270 which is positioned on the upper display panel 200. Therefore, each of the upper unit electrode and the lower unit electrode may include the first part R1, the second part R2, and the third part R3, in which the first part R1, the second part R2, and the third part R3 may each be divided into two regions in the upper unit electrode and the lower unit electrode and each part may be divided into four regions in one pixel area.

Further, referring to FIG. 2, the alignment of the liquid crystal molecules for the pixel area according to an exemplary embodiment may be appreciated. Meanwhile, in detail, a first fine branch part and a second fine branch parts 194a and 194b which are positioned at one side based on the horizontal stem parts 192a and 192b in the upper unit electrode extend to be inclined in the first direction. In this case, the liquid crystal molecules of the liquid crystal layer which is positioned at one side of the horizontal stem part may be aligned along the first direction.

Further, the first fine branch part and the second fine branch parts 194a and 194b which are positioned at the other side based on the horizontal stem parts 192a and 192b in the upper unit electrode extend to be inclined in the second direction. In this case, the liquid crystal molecules 31 of the liquid crystal layer which is positioned at the other side of the horizontal stem part may be aligned along the second direction.

Similarly, the first fine branch part and the second fine branch part which are positioned at one side based on the horizontal stem parts 192a and 192b in the lower unit electrode extend to be inclined in the second direction. In this case, the liquid crystal molecules of the liquid crystal layer 3 which is positioned at one side of the horizontal stem part may be aligned along the second direction.

Further, the first fine branch part and the second fine branch part which are positioned at the other side based on the horizontal stem parts 192a and 192b in the lower unit electrode extend to be inclined in the first direction. In this case, the liquid crystal molecules of the liquid crystal layer which is positioned at the other side of the horizontal stem part may be aligned along the first direction.

Figure 6:
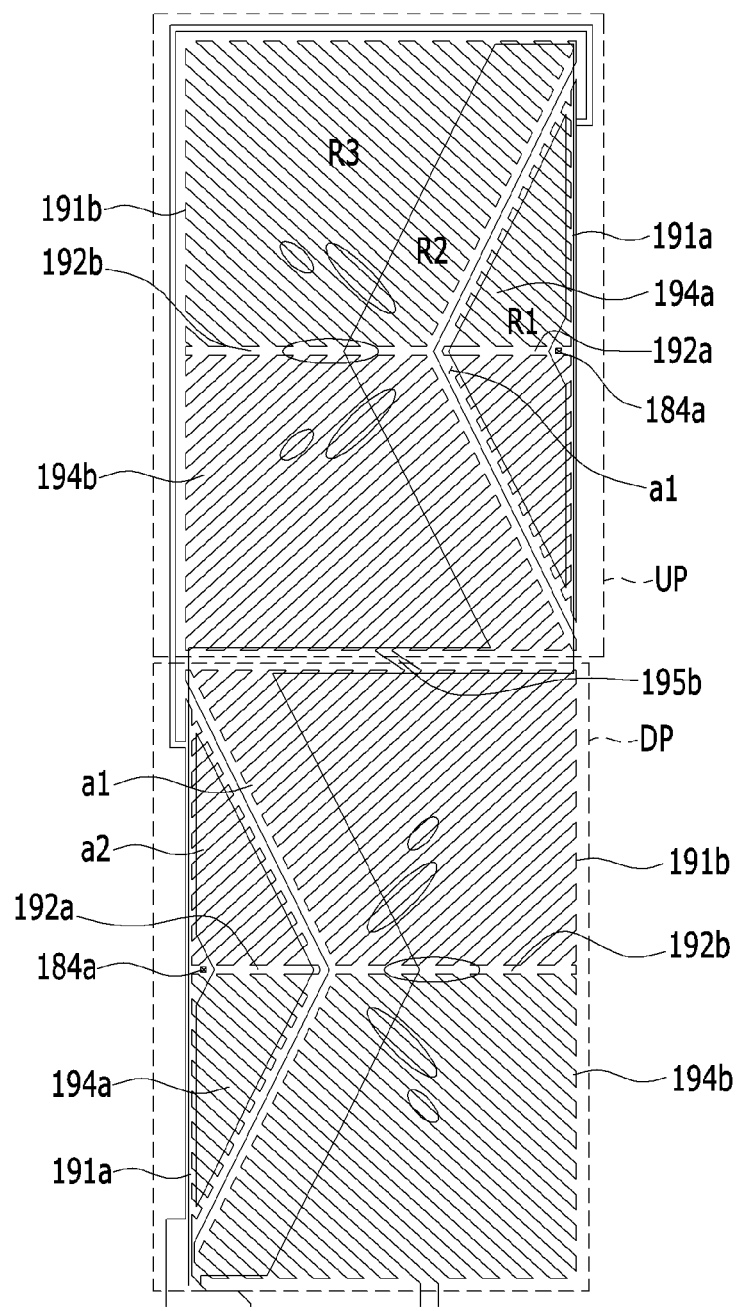
FIG. 6 is a plan view of a basic pixel according to an exemplary embodiment.
Figure 7:
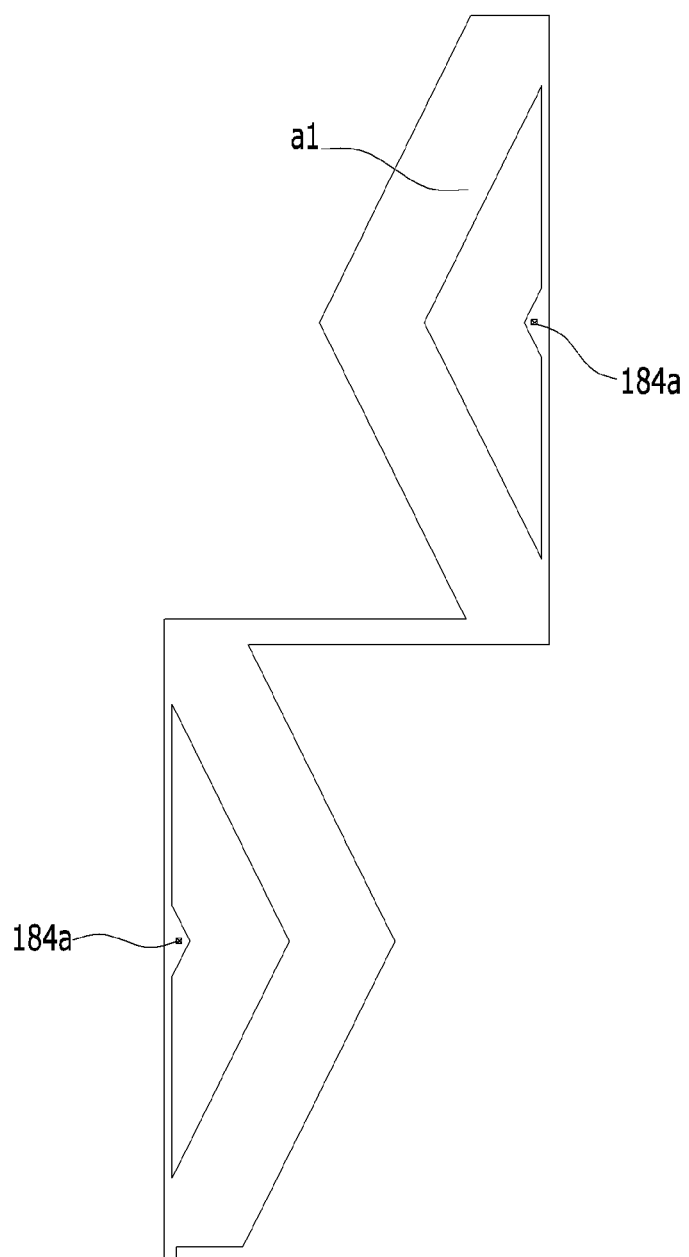
FIG. 7 is a plan view of a first subregion electrode of a first subpixel electrode according to an exemplary embodiment.
Figure 8:
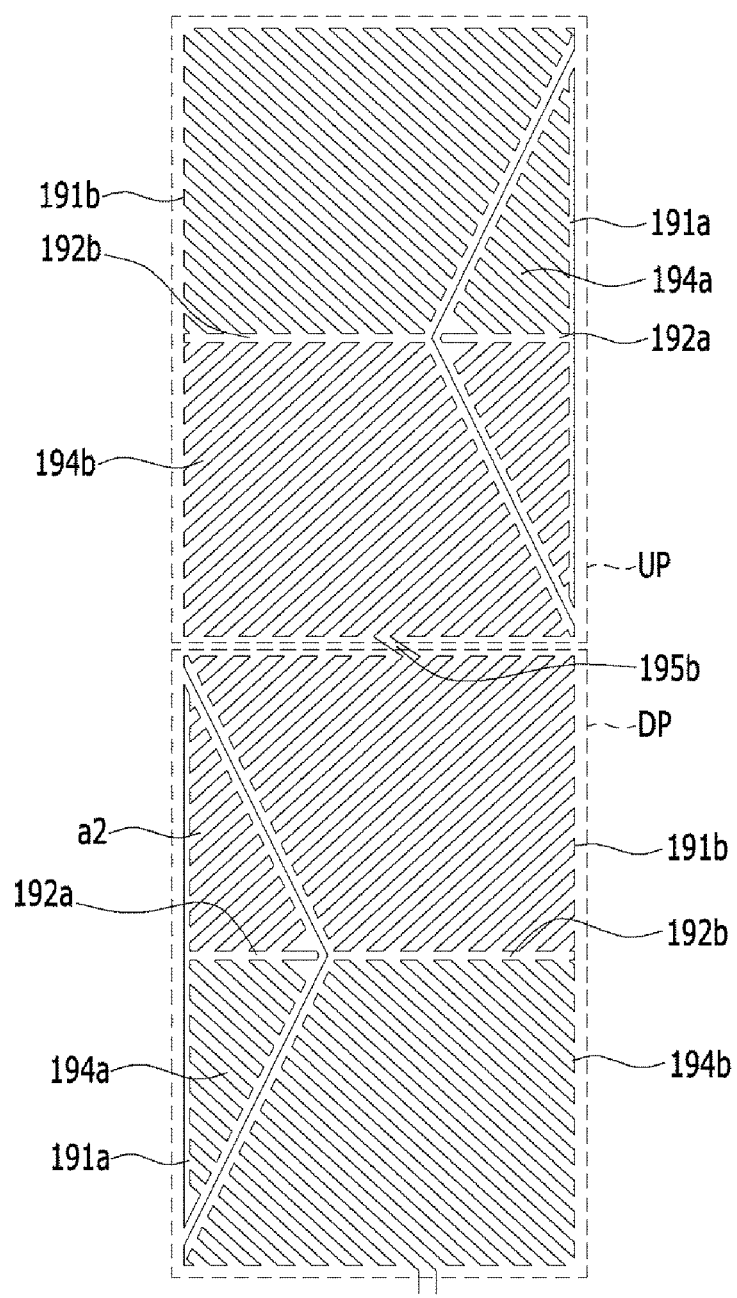
FIG. 8 is a plan view of a second subregion electrode and a second subpixel electrode of the first subpixel electrode according to an exemplary embodiment.
Figure 9A:
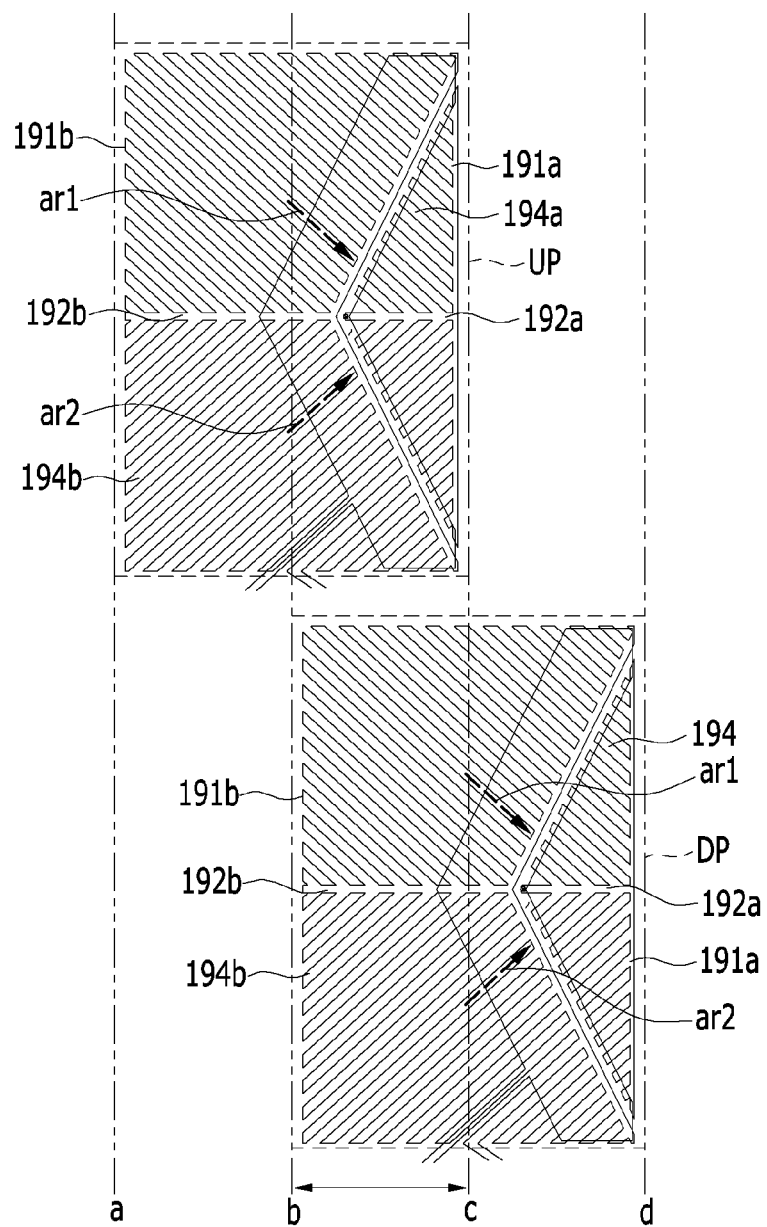
FIGS. 9A to 9B are diagrams illustrating a shift of a panel according to a manufacturing of the curved display device.
Figure 9B:
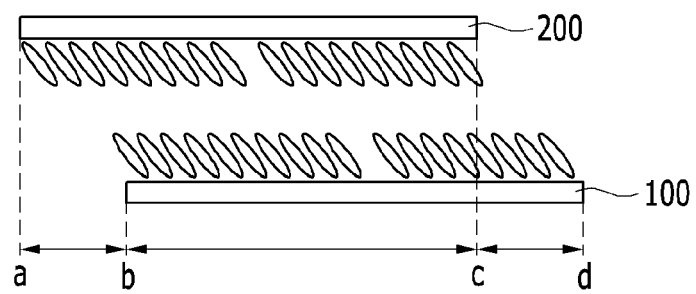

Next, a shape of a basic pixel electrode according to an exemplary embodiment will be described in detail with reference to FIGS. 6 to 9. FIG. 6 is a plan view of a basic pixel according to an exemplary embodiment, FIG. 7 is a plan view of a first subregion electrode a1 of a first subpixel electrode 191a according to an exemplary embodiment], FIG. 8 is a plan view of a second subregion electrode a2 and a second subpixel electrode of the first subpixel electrode 191a according to an exemplary embodiment, and FIGS. 9A to 9B are diagrams illustrating a shift of a panel according to a manufacturing of the curved display device.

Referring to FIG. 6, one pixel area of the display device according to the exemplary embodiment includes the first subpixel electrode 191a and the second subpixel electrode 191b, includes the upper unit electrode UP and the lower unit electrode DP which are distinguished according to position, and may be divided into the first part R1, the second part R2, and the third part R3 which are distinguished depending on the magnitude of the applied electric field.

First, the upper unit electrode UP and the lower unit electrode DP which are divided according to position in connection with the first subpixel electrode 191a and the second subpixel electrode 191b will be described with reference to FIGS. 6 to 8. Each of the upper unit electrode UP and the lower unit electrode DP includes a first subpixel electrode 191a and a second subpixel electrode 191b, and one upper unit electrode UP, the lower unit electrode DP, and the common electrode 270 form one pixel area.

Referring to FIG. 6, the first subregion electrodes a1 of the first subpixel electrodes 191a which are positioned in the upper unit electrode UP and the lower unit electrode DP are positioned on different layers from the second subregion electrodes a2 of the first subpixel electrodes 191a. For example, the first subregion electrodes a1 of the first subpixel electrodes 191a may be positioned on different layers, having the insulating layer disposed therebetween The first subregion electrode a1 has a shape having an oblique side parallel with an oblique side of the second subregion electrode a2, and, for example, is two-dimensionally similar to a space between the second subregion electrode a2 and the second subpixel electrode 191b as illustrated in FIG. 2. However, the first subregion electrode a1 is formed to be wider than the space so as to overlap the second subpixel electrode 191b.

The second subregion electrode a2 is connected to the first subregion electrode a1 through the contact hole 184a and is applied with a first data voltage which is applied to the first subregion electrode a1.

Therefore, the upper unit electrode UP and the lower unit electrode DP each include the first subregion electrode a1, and the first subregion electrodes a1 which are positioned in the upper unit electrode and the lower unit electrode are disposed at a symmetrical position and may have the same shape.

Next, the second subregion electrode a2 of the first subpixel electrode 191a will be described. The second subregion electrode a2 which is positioned in the one unit electrode UP and one unit electrode DP may have approximately a triangle which is formed of one bottom side and two oblique sides, in which the one bottom side may correspond to an edge of the one pixel area.

The second subregion electrode a2 of the first subpixel electrode 191a which is positioned in the upper unit electrode UP includes the first horizontal stem part 192a positioned at a center of the second subregion electrode a2 and the plurality of first fine branch parts 194a extending from the first horizontal stem part 192a to extend in different two directions. In this case, the first horizontal stem part 192a may be vertical to one bottom side. The second subregion electrode a2 positioned in the lower unit electrode DP may also include the first horizontal stem part 192a and the first fine branch part 194a and the shape of the lower unit electrode and the shape of the upper unit electrode may be symmetrical to each other.

The plurality of first fine branch parts 194a may be inclined by about 40° to 50° based on the horizontal stem part 192a. The liquid crystal molecules 31 of the liquid crystal layer 3 which is positioned in the first part R1 lie in two different directions, by a fringe field generated by edges of the plurality of first fine branch parts 194a. In more detail, the liquid crystal molecules 31 are inclined in a direction parallel with a length direction in which the plurality of first fine branch parts 194a extend.

The second subregion electrode a2 of the first subpixel electrodes 191a which are positioned in the upper unit electrode and the lower unit electrode may have the same shape, positioned at the same position, or may be symmetrical to each other as illustrated in FIG. 6.

Next, the second subpixel electrode 191b may include the second horizontal stem part 192b in each of the upper unit electrode and the lower unit electrode and the second fine branch parts 194b which extend in two different directions from the second horizontal stem part 192b.

The second subpixel electrode 191b includes an edge parallel with one pixel area edge and may include oblique sides corresponding to two oblique sides which are included in the second subregion electrode a2 of the first subpixel electrode 191a. Therefore, reviewing the upper unit electrode or the lower unit electrode, the second subpixel electrode 191b and the second subregion electrode a2 of the first subpixel electrode may be disposed to indicate a quadrangular shape of which the horizontal and vertical lengths are similar, without overlapping each other on a plane. When the upper unit electrodes or the lower unit electrodes are joined to each other in a vertical direction, one pixel area in which a vertical length is longer than a horizontal length is formed.

The plurality of second fine branch parts 194b may be inclined by about 40° to 50° based on the second horizontal stem part 192b. Therefore, an angle formed by the second fine branch parts 194b which are positioned at both sides based on the second horizontal stem part 192b may range from 80 to 100°. The liquid crystal molecules 31 of the liquid crystal layer 3 which is positioned in the third part R3 lie in two different directions, by a fringe field generated by edges of the plurality of second fine branch parts 194b. In more detail, the liquid crystal molecules 31 are inclined in a direction parallel with a length direction in which the plurality of second fine branch parts 194b extend.

Further, the first fine branch part 194a and the second fine branch part 194b may have the same slope. In detail, the first fine branch part 194a and the second fine branch part 194b which are positioned at the same side of each horizontal stem part extend while having the same slope. Therefore, even when different magnitudes of voltages are applied, the liquid crystal molecules 31 positioned at the same side may be aligned in the same direction.

Further, the second subpixel electrodes 191b which are positioned in the upper unit electrode UP and the lower unit electrode DP may be electrically connected to each other through the second connection part 195b. For example, the second connection part 195b may extend from the end of the second fine branch part 194b of the second subpixel area to connect between the upper unit electrode and the lower unit electrode.

Next, the first part R1, the second part R2, and the third part R3 which are divided according to the magnitude of the applied electric field will be described.

First, in the first part R1, the second subregion electrode a2 of the first subpixel electrode 191a which is positioned on the lower display panel and the common electrode 270 which is positioned on the upper display panel 200 generate an electric field. In this case, the voltage applied to the second subregion electrode a2 has the largest value among the voltages applied to one pixel area and therefore an area in which the strength of the electric field is large may be formed.

Next, the second part R2 is an area in which the first subregion electrode a1 of the first subpixel electrode 191a and the second subpixel electrode 191b overlap each other. The liquid crystal molecules 31 of the liquid crystal layer 3 are aligned by the electric field formed between the second fine branch part of the second subpixel electrode 191b and the common electrode, along with the electric field formed between the first subregion electrode a1 and the common electrode of the upper display panel. In this case, because an effect of the electric field by the first subregion electrode a1 of the first subpixel electrode 191a and an effect of the electric field by the second subpixel electrode 191b coexist in the second part R2, the strength of the electric field applied to the liquid crystal layer which is positioned in the second part R2 is smaller than that of the electric field applied to the liquid crystal layer positioned in the first part R1 and is larger than the strength of the electric field applied to the liquid crystal layer positioned in the third part R3.

Referring back to FIG. 6, in the third part R3, the second subpixel electrode 191b of the lower display panel 100 and the common electrode of the upper display panel 200 generate an electric field together. In this case, the voltage applied to the second subpixel electrode 191b is applied with a voltage lower than the first voltage by the voltage dividing transistor, as the second voltage applied through a second switching element. Therefore, the electric field formed between the second subpixel electrode 191b and the common electrode is smaller than the electric field formed between the second subregion electrode a2 of the first subpixel electrode 191a and the common electrode.

Therefore, the strength of the electric field applied to the liquid crystal layer which is positioned in the first part R1 is largest and the strength of the electric field applied to the liquid crystal layer which is positioned in the third part R3 is smallest. Because an effect of the electric field by the first subregion electrode a1 of the first subpixel electrode 191a is present in the second part R2, the strength of the electric field applied to the liquid crystal layer which is positioned in the second part R2 is smaller than that of the electric field applied to the liquid crystal layer positioned in the first part R1 and is larger than the strength of the electric field applied to the liquid crystal layer positioned in the third part R3.

As such, in the display device according to an exemplary embodiment, one pixel area is divided into the first part R1 in which the first subpixel electrode 191a to which a relatively higher first voltage is applied is positioned, the second part R2 in which a portion of the first subpixel electrode 191a and a portion of the second subpixel electrode 191b to which a relatively lower second voltage is applied overlap each other, having the insulating layer disposed therebetween, and the third part R3 in which only the second subpixel electrode 191b to which the relatively lower second voltage is applied is positioned.

Therefore, the strength of the electric field applied to the liquid crystal molecules corresponding to the first part R1, the second part R2, and the third part R3 is different and thus the inclined angle of the liquid crystal molecules is different, such that luminance of each part is different. As such, when one pixel area is divided into three parts having different luminance, the change in transmittance in response to gray is smoothly controlled, and the transmittance in response to the change in gray even in the low gray and the high gray at the side may be prevented from being suddenly changed. Further, the accurate gray representation may be made even in the low gray and the high gray while front side visibility approximates the front visibility.

The first fine branch part and the second fine branch parts 194a and 194b which are positioned at one side based on the horizontal stem parts 192a and 192b in the upper unit electrode extend so as to be inclined in the first direction. In this case, the liquid crystal molecules of the liquid crystal layer which is positioned at one side of the horizontal stem part may be aligned along the first direction.

Further, the first fine branch part and the second fine branch parts 194a and 194b which are positioned at the other side based on the horizontal stem parts 192a and 192b in the upper unit electrode extend to be inclined in the second direction. In this case, the liquid crystal molecules 31 of the liquid crystal layer which is positioned at the other side of the horizontal stem part may be aligned along the second direction.

Similarly, the first fine branch part and the second fine branch part 194a and 194b which are positioned at one side based on the horizontal stem parts 192a and 192b in the lower unit electrode extend to be inclined in the second direction. In this case, the liquid crystal molecules of the liquid crystal layer 3 which is positioned at one side of the horizontal stem part may be aligned along the second direction.

Further, the first fine branch part and the second fine branch part which are positioned at the other side based on the horizontal stem parts 192a and 192b in the lower unit electrode extend to be inclined in the first direction. In this case, the liquid crystal molecules of the liquid crystal layer which is positioned at the other side of the horizontal stem part may be aligned along the first direction.

Referring to FIG. 9A, in providing the curved display device, when a force is applied to the display panel, the upper display panel 200 and the lower display panel 100 may be misaligned left and right.

In this case, according to an exemplary embodiment, the first fine branch part and the second fine branch part which are positioned at one side based on the horizontal stem parts 192a and 192b extend to be inclined in the same direction and thus the liquid crystal molecules are also aligned in the same direction(as illustrated in FIG. 9A, the arrow ar1 direction).

The first fine branch part and the second fine branch part which are positioned at the other side based on the horizontal stem parts 192a and 192b also extend to be inclined in the same direction and thus the liquid crystal molecules 31 are aligned in the same direction. (as illustrated in FIG. 9B, the arrow ar2 direction)

Therefore, the fine branch parts which are positioned at the upper and lower sides based on the horizontal stem parts 192a and 192b represent the alignment of the same liquid crystal molecules independent of the applied voltage. As illustrated in FIG. 9B, even when the upper display panel 200 or the lower display panel 100 is misaligned left and right, the liquid crystal molecules which are identically aligned are positioned between the upper and lower electrodes and therefore the revelation of texture may be reduced. Namely, as illustrated in FIG. 9B, one edge a of the upper display panel 200 and one edge b of the lower display panel 100 are misaligned and the other edge c of the upper display panel 200 and the other edge d of the the lower display panel 100 are misaligned according to the misaligned left and right display panels of the present invention, and thus, the revelation of texture may be reduced.

Figure 10:
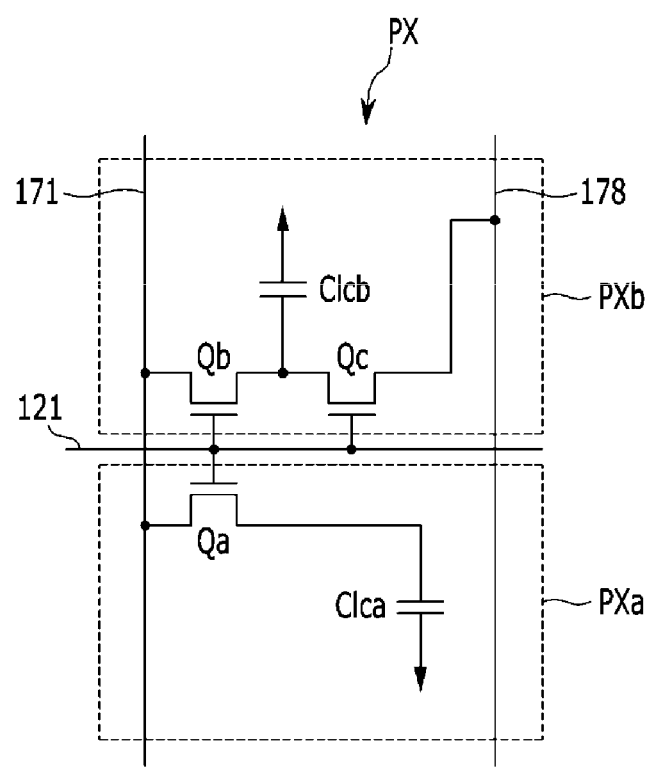
FIG. 10 is a circuit diagram according to an exemplary embodiment.

FIG. 10 is a circuit diagram of one pixel according to an exemplary embodiment.

Referring to FIG. 10, one pixel PX of the display device according to an exemplary embodiment includes a plurality of signal lines which include a gate line 121 transferring a gate signal, a data line 171 transferring a data signal, and a voltage dividing reference voltage line 178 which transfers voltage dividing reference voltage, first, second, and third switching elements Qa, Qb, and Qc which are connected to the plurality of signal lines, and first and second liquid crystal capacitors Clca and Clcb.

The first and second switching elements Qa and Qb are each connected to the gate line 121 and the data line 171 and the third switching element Qc is connected to an output terminal of the second switching element Qb and the voltage dividing reference voltage line 178.

The first and second switching elements Qa and Qb are a three terminal element, such as a thin film transistor, and control terminals thereof are connected to the gate line 121 and input terminals thereof are connected to the data line 178, an output terminal of the first switching element Qa is connected to the first liquid crystal capacitor Clca, and an output terminal of the second switching element Qb is connected to input terminals of the second liquid crystal capacitor Clcb and the third switching element Qc.

The third switching element Qc is also a three terminal element, such as the thin film transistor, and a control terminal thereof is connected to the gate line 121, an input terminal thereof is connected to the second liquid crystal capacitor Clcb, and an output terminal thereof is connected to the voltage dividing reference voltage line 178.

When a gate on signal is applied to the gate line 121, the first, second, and third switching elements Qa, Qb, and Qc which are connected to the gate line 121 are turned on. Therefore, a data voltage applied to the data line 171 is applied to a first liquid crystal capacitor Clca and a second liquid crystal capacitor Clcb, respectively, through the first and second switching elements Qa and Qb which are turned on. Further, the first liquid crystal capacitor Clca and the second liquid crystal capacitor Clcb are charged with a difference between a common voltage Vcom and the applied data voltage. In this case, the same data voltage is transferred to the first liquid crystal capacitor Clca and the second liquid crystal capacitor Clcb through the first and second switching elements Qa and Qb but the charging voltage of the second liquid crystal capacitor Clcb is divided through the third switching element Qc. Therefore, the charging voltage of the second liquid crystal capacitor Clcb is smaller than that of the first liquid crystal capacitor Clca, such that the luminance of the two subpixels PXa and Pxb may be changed. That is, the voltage charged in the first liquid crystal capacitor Clca is higher than the voltage charged in the second liquid crystal capacitor Clcb and the voltage charged in the first liquid crystal capacitor Clca and the voltage charged in the second liquid crystal capacitor Clcb are different from each other. Because the voltage of the first liquid crystal capacitor Clca and the voltage of the second liquid crystal capacitor Clcb are different from each other, inclined angles of liquid crystal molecules in the first subpixel and the second subpixel are different from each other, and thus the luminance of the first subpixel and the luminance of the second subpixel are different from each other. The first subpixel PXa correspond to first subpixel electrode 191a and the second subpixel PXb correspond to the second subpixel electrode 191b Therefore, when the voltage charged in the first liquid crystal capacitor Clca and the voltage charged in the second liquid crystal capacitor Clcb are appropriately controlled, the image viewed from a side may maximally approach the image viewed from a front, thereby improving the side visibility.

However, the structure of the pixel PX of the liquid crystal display according to an exemplary embodiment is not limited to the exemplary embodiment illustrated in FIG. 10 and therefore may be various. That is, in order to make the voltage charged in the first liquid crystal capacitor Clca and the voltage charged in the second liquid crystal capacitor Clcb different, the exemplary embodiment illustrated in FIG. 10 includes the second liquid crystal capacitor Clcb and the third switching element Qc connected to the voltage dividing reference voltage line 178, but in the case of a liquid crystal display according to another exemplary embodiment, the second liquid crystal capacitor Clcb may also be connected to a step-down capacitor. In detail, the liquid crystal display includes the third switching element which includes a first terminal connected to a step-down gate line, a second terminal connected to the second liquid crystal capacitor Clcb, and a third terminal connected to the step-down capacitor to charge a portion of an amount charged in the second liquid crystal capacitor Clcb in the step-down capacitor, thereby making the charging voltage between the first liquid crystal capacitor Clca and the second liquid crystal capacitor Clcb be differently set. Further, in the case of the liquid crystal display according to another exemplary embodiment, the first and second liquid crystal capacitors Clca and Clcb are connected to different data lines to be applied with different data voltages, thereby making the charging voltage between the first and second liquid crystal capacitors Clca and Clcb be differently set. In addition, the charging voltage between the first and second liquid crystal capacitors Clca and Clcb may be differently set by other several methods.

Figure 11:
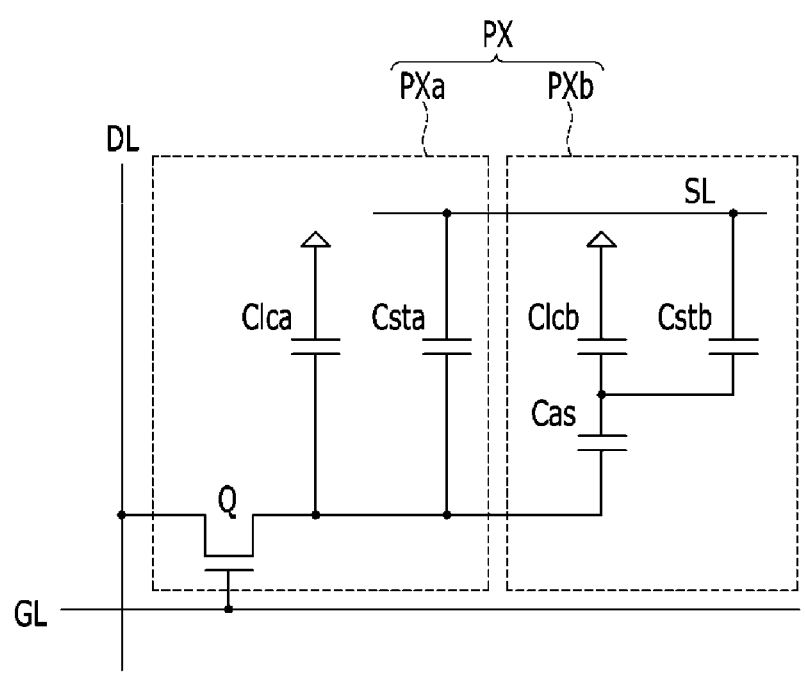
FIGS. 11, 12, 13, and 14 are circuit diagrams according to another exemplary embodiment.

Hereinafter, the exemplary embodiment of FIG. 11 will be described.

The liquid crystal display according to an exemplary embodiment includes a signal line which includes a plurality of gate lines GLs, a plurality of data lines DLs, and a plurality of sustain electrode lines SL and a plurality of pixels PXs connected thereto. Each pixel PX includes a pair of first and second subpixels PXa and PXb, in which the first subpixel PXa is provided with a first subpixel electrode which may correspond to first subpixel electrode 191a and a second subpixel PXb which may correspond to second subpixel electrode 191b is provided with a second subpixel electrode.

The liquid crystal display according to an exemplary embodiment further includes a switching element Q which is connected to gate line GL and the data line DL, a first liquid crystal capacitor Clca and a first sustain capacitor Csta formed in the first subpixel PXa while being connected to the switching element Q, a second liquid crystal capacitor Clcb and a second sustain capacitor Cstb formed in the second subpixel PXb while being connected to the switching element Q, and an auxiliary capacitor Cas formed between the switching element Q and the second liquid crystal capacitor Clcb.

The switching element Q is a three terminal element such as a thin film transistor included in the lower display panel 100 and a control terminal thereof is connected to the gate line GL, an input terminal thereof is connected to the data line DL, and an output terminal thereof is connected to the first liquid crystal capacitor Clca, the first sustain capacitor Csta, and the auxiliary capacitor Cas.

One terminal of the auxiliary capacitor Cas is connected to the output terminal of the switching element Q and the other terminal thereof is connected to the second liquid crystal capacitor Clcb and the second sustain capacitor Cstb.

The charging voltage of the second liquid crystal capacitor Clcb is lower than that of the first liquid crystal capacitor Clca due to the auxiliary capacitor Cas, thereby improving the side visibility of the liquid crystal display.

Figure 12:
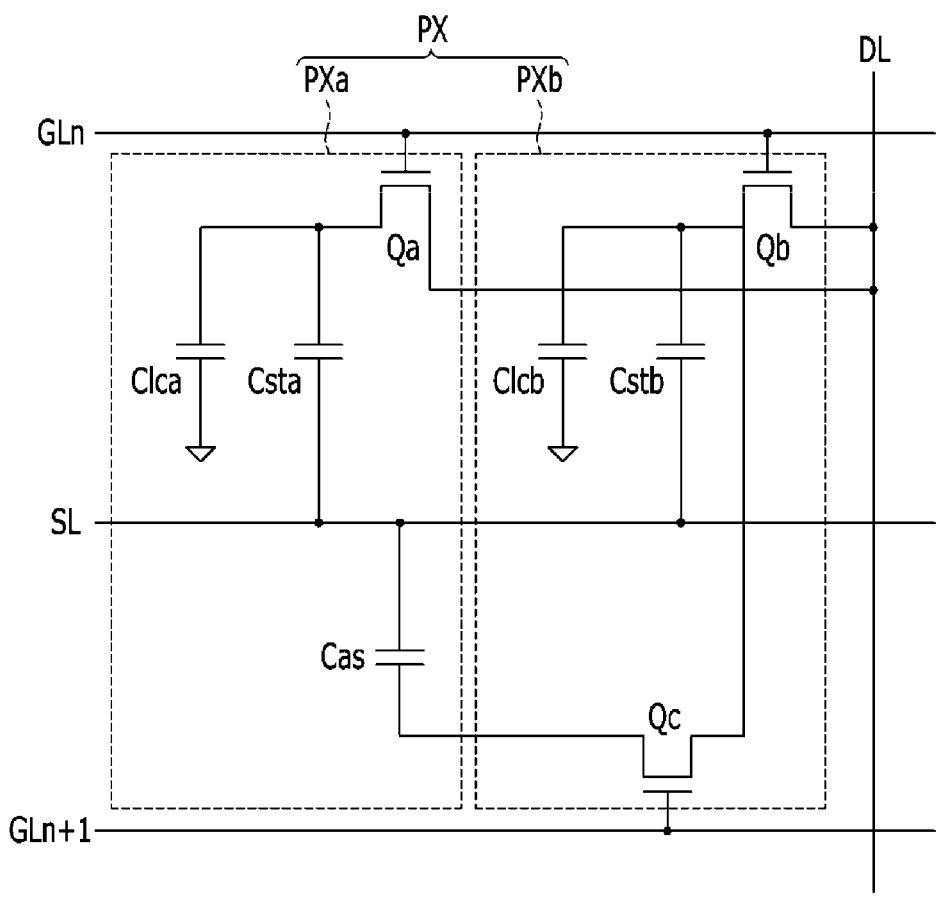

Hereinafter, the exemplary embodiment of FIG. 12 will be described.

The liquid crystal display according to an exemplary embodiment includes a signal line which includes a plurality of gate lines GLn and GLn+1, a plurality of data lines DLs, and a plurality of sustain electrode lines SL and a plurality of pixel PXs connected thereto. Each pixel PX includes a pair of first and second subpixels PXa and PXb, in which the first subpixel PXa is provided with a first subpixel electrode and a second subpixel PXb is provided with a second subpixel electrode.

The liquid crystal display according to an exemplary embodiment further includes a first switching element Qa and a second switching element Qb which are connected to the gate line GLn and the data line DL, the first liquid crystal capacitor Clca and the first sustain capacitor Csta which are formed in the first subpixel PX while being connected to the first switching element Qa, the second liquid crystal capacitor Clcb and the second sustain capacitor Cstb which are formed in the second subpixel while being connected to the second switching element Qb, the third switching element Qc which is connected to the second switching element Qb and is switched by the gate line GLn+1 of a next stage, and the auxiliary capacitor Cas which is connected to the third switching element Qc.

The first switching element Qa and the second switching element Qb are a three terminal element such as the thin film transistor included in the lower display panel 100 and a control terminal thereof is connected to the gate line GLn, the input terminal thereof is connected to the data line DL, and an output terminal thereof is connected to the first liquid crystal capacitor Clca, the first sustain capacitor Csta, the second liquid crystal capacitor Clcb, and the second sustain capacitor Cstb, respectively.

The third switching element Qc is also the three terminal element, such as the thin film transistor included in the lower display panel 100, and a control terminal thereof is connected to the gate line GLn+1 of a next stage, an input terminal thereof is connected to the second liquid crystal capacitor Clcb, and an output terminal thereof is connected to the auxiliary capacitor Cas.

One terminal of the auxiliary capacitor Cas is connected to the output terminal of the third switching element Qc and the other terminal thereof is connected to the sustain electrode line SL.

Reviewing the operation of the liquid crystal display according to an exemplary embodiment, when a gate-on voltage is applied to the gate line GLn, the first switching element and the second switching element Qa and Qb which are connected thereto are turned on and the data voltage of the data line DL is applied to the first and second subpixel electrodes.

Next, when a gate-off voltage is applied to the gate line GLn and a gate-on voltage is applied to the gate line GLn+1 of a next stage, the first and second switching elements Qa and Qb are turned off and the third switching element Qc is turned on. Therefore, a charge of the second subpixel electrode which is connected to the output terminal of the second switching element Qb flows in the auxiliary capacitor Cas and thus the voltage of the second liquid crystal capacitor Clcb drops.

As a result, the side visibility of the liquid crystal display may be improved by making a charging voltage of the first and second liquid crystal capacitors Clca and Clcb different.

Figure 13:
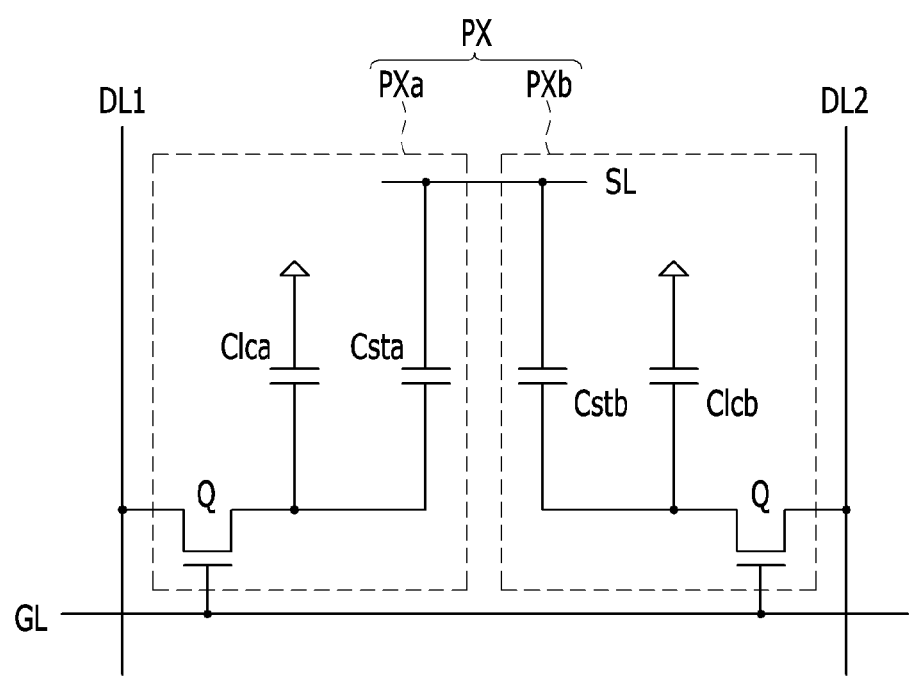

Hereinafter, the exemplary embodiment of FIG. 13 will be described.

The liquid crystal display according to an exemplary embodiment includes a signal line which includes the plurality of gate lines GLs, a plurality of data lines DL1 and DL2, and the plurality of sustain electrode lines SL and the plurality of pixels PXs connected thereto. Each pixel PX includes the pair of first and second liquid crystal capacitors Clca and Clab and the first and second sustain capacitors Csta and Cstb.

Each subpixel includes one liquid crystal capacitor and sustain capacitor and additionally includes one thin film transistor Q. The thin film transistors Q of two subpixels which belong to one pixel are connected to the same gate line GL but are connected to different data lines DL1 and DL2. Different data lines DL1 and DL2 simultaneously apply different levels of data voltage and thus the first and second liquid crystal capacitors Clca and Clcb of the two subpixels each have a different charging voltage. As a result, it is possible to improve the side visibility of the liquid crystal display.

Hereinafter, the exemplary embodiment of FIG. 14 will be described.

Figure 14:
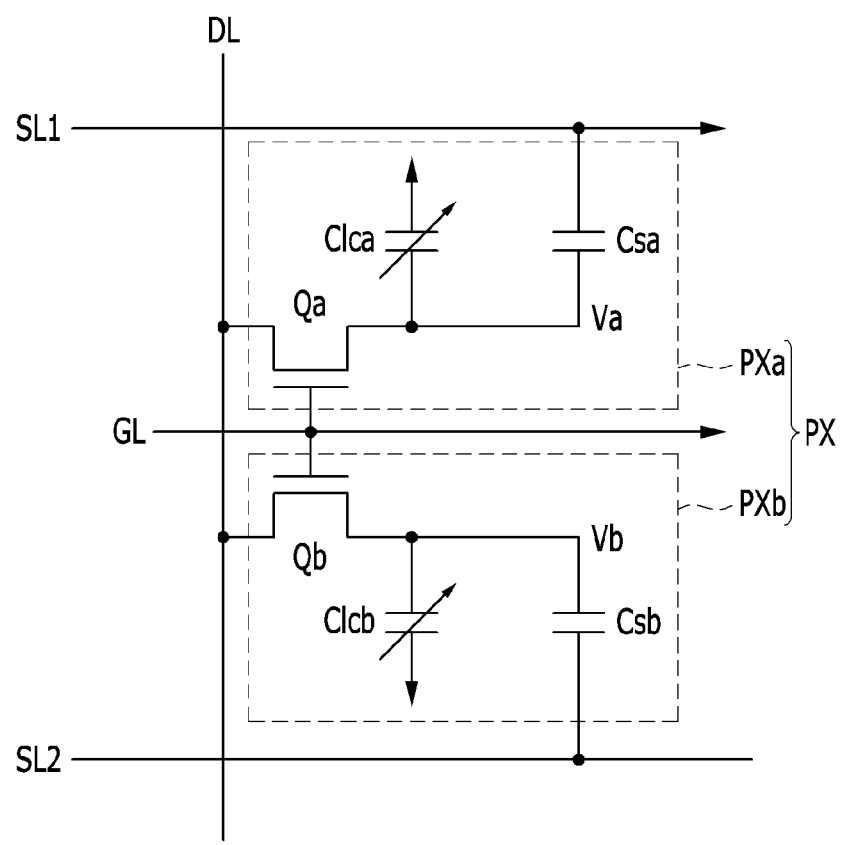

As illustrated in FIG. 14, the liquid crystal display according to an exemplary embodiment includes the gate line GL, the data line DL, a first power supply line SL1, a second power supply line SL2, the gate line GL, and the first switching element Qa and the second switching element Qb connected to the data line DL.

The liquid crystal display according to an exemplary embodiment further includes an auxiliary step-up capacitor Csa and the first liquid crystal capacitor Clca which are connected to the first switching element Qa and the auxiliary step-down capacitor Csb and the second liquid crystal capacitor Clcb which are connected to the second switching element Qb.

The first switching element Qa and the second switching element Qb are configured of the three terminal element such as the thin film transistor. The first switching element Qa and the second switching element Qb are connected to the same gate line GL and the same data line DL and are turned on at the same timing to output the same data signal.

The first power supply line SL1 and the second power supply line SL2 are applied with a voltage in a form swung at a predetermined period. The first power supply line SL1 is applied with a first low voltage for a predetermined period (for example, 1 H) and is applied with a first high voltage for a subsequent predetermined period. The second power supply line SL2 is applied with a second high voltage for a predetermined period and is applied with a second low voltage for a subsequent predetermined period. In this case, the first period and the second period are repeated plural times for one frame and thus the first power supply line SL1 and the second power supply line SL2 are applied with a voltage in a swing form. In this case, the first low voltage and the second low voltage may be same and the first high voltage and the second high voltage may also be same.

The auxiliary step-up capacitor Csa is connected to the first switching element Qa and the first power supply line SL1 and the auxiliary step-down capacitor Csb is connected to the second switching element Qb and the second power supply line SL2.

A voltage Va of a terminal (hereinafter, referred to as 'first terminal') of a portion where the auxiliary step-up capacitor Csa is connected to the first switching element Qa is low when the first power supply line SL1 is applied with a first low voltage and is high when the first power supply line SL1 is applied with a first high voltage. Next, as the voltage of the first power supply line SL1 is swung, the voltage Va of the first terminal is also swung.

Further, a voltage Vb of a terminal (hereinafter, referred to as 'second terminal') of a portion where the auxiliary step-down capacitor Csb is connected to the first switching element Qb is high when the second power supply line SL2 is applied with a second high voltage and is low when the second power supply line SL2 is applied with a second low voltage. Next, as the voltage of the second power supply line SL2 is swung, the voltage Vb of the second terminal is also swung.

As such, even though the two subpixels are applied with the same data voltage, the voltage Va and Vb of the pixel electrodes of the two subpixels is changed depending on the magnitude of the voltage swung in the first and second power supply lines SL1 and SL2, thereby making the transmittance of the two subpixels different and improving the side visibility.

The exemplary embodiment of the present invention illustrated in FIGS. 10 to 14 [does not use the reference voltage line but any line parallel with the data line vertically crosses a center of the display area of the pixel to improve the display quality.

Hereinabove, although exemplary embodiments have been described in detail, the scope of the present invention is not limited thereto, but modifications and alterations made by those skilled in the art using the basic concept of the inventive concept defined in the disclosure, including following claims.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the disclosure, including the appended claims.

DESCRIPTION OF SYMBOLS

| | |
|---|---|
| 100, 200: Display panel | 121: Gate line |
| 124: Gate electrode | 131: Reference voltage line |
| 140: Gate insulating layer | 154: Semiconductor |
| 171: Data line | 173: Source electrode |
| 175: Drain electrode | 180b: Insulating layer |
| 184a, 185a, 185b: Contact hole | 191: Pixel electrode |
| 191a: First subpixel electrode | 191b: Second subpixel electrode |
| 192a, 192b: Horizontal stem part | 194a, 194b: Fine branch part |
| 195a, 195b: Connection part | 210: Second insulating substrate |
| 220: Light blocking member | 230: Color filter |

What is claimed is:

1. A display device, comprising:
a first insulating substrate;
an insulating layer positioned on the first insulating substrate;
a pixel electrode including a first subregion electrode which is applied with a first voltage and positioned beneath the insulating layer, a first subpixel electrode which includes a second subregion electrode positioned on the insulating layer, and a second subpixel electrode which is positioned on the insulating layer and applied with a second voltage;
a second insulating substrate facing the first insulating substrate; and
a common electrode positioned under the second insulating substrate and applied with a common voltage,
wherein one pixel area is divided into a first part in which the second subregion electrode is positioned, a second part in which the first subregion electrode and a portion of the second subpixel electrode overlap each other, and a third part which does not overlap the first subregion electrode in the second subpixel electrode, depending on a voltage difference between the common voltage and the pixel electrode, and
an interface at which an end of the second subregion electrode faces an end of the second subpixel electrode is positioned on the first subregion electrode, having the insulating layer disposed therebetween.

2. The display device of claim 1, wherein:
a voltage difference from the common voltage is greater in the first part than in the second part, and is greater in the second part than in the third part.

3. The display device of claim 2, wherein:
the first subpixel electrode and the second subpixel electrode include an upper unit electrode and a lower unit electrode which are adjacent to each other, having a gap disposed therebetween.

4. The display device of claim 2, wherein:
the first subregion electrode and the second subregion electrode are electrically connected to each other through a contact hole.

5. The display device of claim 2, wherein:
the first subregion electrode overlaps a portion of the second subpixel electrode and is an integrated plate shape for the overlapping part.

6. The display device of claim 1, wherein:
the display device has a curved shape having a predetermined curvature radius.

7. The display device of claim 2, wherein:
the second subregion electrode and the second subpixel electrode each include a horizontal stem part, and a plurality of fine branch parts extend to be inclined in two different directions from the horizontal stem part.

8. The display device of claim 7, further comprising:
a lower display panel including the first insulating substrate, the insulating layer, and the pixel electrode;
an upper display panel including the second insulating substrate and the common electrode; and
a liquid crystal layer injected between the lower display panel and the upper display panel,
wherein liquid crystal molecules of the liquid crystal layer positioned at one side of the horizontal stem part are aligned in a first direction, and
the liquid crystal molecules of the liquid crystal layer positioned at the other side of the horizontal stem part are aligned in a second direction.

9. The display device of claim 7, wherein:
an angle formed by an extending direction of the plurality of fine branch parts positioned at one side of the horizontal stem part and an extending direction of the plurality of fine branch parts positioned at the other side of the horizontal stem part ranges from 80 to 100°.

10. The display device of claim 2, wherein:
the second subregion electrode and the second subpixel electrode are disposed to form a quadrangle on a plane.

11. The display device of claim 10, wherein:
the second subregion electrode and the second subpixel electrode have different slopes to a horizontal stem part and have an interface spaced at a predetermined interval.

12. The display device of claim 11, wherein:
an area corresponding to the second part in the first subregion electrode has an integrated plate shape.

13. The display device of claim 2, wherein:
the first subpixel electrode and the second subpixel electrode each include a first connection part and a second connection part which connect between an upper unit electrode and a lower unit electrode.

14. The display device of claim 13, wherein:
the first connection part is positioned at a gap between the upper unit electrode and the lower unit electrode on the same layer as the first subregion electrode and is parallel with a horizontal stem part.

15. The display device of claim 13, wherein:
the second connection part extends from an end of at least one of a plurality of fine branch parts of the second subpixel electrode to connect between the upper unit electrode and the lower unit electrode.

16. The display device of claim 1, further comprising:
a first thin film transistor connected to the first subpixel electrode;
a second thin film transistor connected to the second subpixel electrode; and
a voltage dividing transistor connected to the second thin film transistor,
wherein the first thin film transistor is connected to the first subregion electrode of the first subpixel electrode.

17. The display device of claim 16, wherein:
the second subregion electrode is applied with the first voltage from the first subregion electrode.

18. The display device of claim 1, wherein:
the first subregion electrode overlaps a portion of the second subpixel electrode and a difference between the first voltage and the common voltage is larger than a difference between the second voltage and the common voltage.

19. The display device of claim 1, wherein:
the first subregion electrode has an edge in a concave hexagonal shape which has a double arrow bracket (<< or >>), the second subregion electrode is a triangle shape formed of one bottom side and two oblique sides, and the second subpixel electrode has a concave pentagonal shape.

20. The display device of claim 1, wherein:
the second subregion electrode and the second subpixel electrode include a plurality of fine branch parts which extend in two different directions.

* * * * *